(12) United States Patent
Egger et al.

(10) Patent No.: US 10,140,247 B2
(45) Date of Patent: Nov. 27, 2018

(54) ELECTRONIC DEVICE, RECONFIGURABLE PROCESSOR AND CONTROLLING METHODS THEREOF

(71) Applicants: Samsung Electronics Co., Ltd., Gyeonggi-do (KR); Seoul National University R & DB Foundation, Seoul (KR)

(72) Inventors: Bernhard Egger, Seoul (KR); Ho-chan Lee, Seoul (KR); Yeon-bok Lee, Seoul (KR); Suk-jin Kim, Seoul (KR)

(73) Assignees: Samsung Electronics Co., Ltd (KR); Seoul National University R&DB Foundation (KR)

( * ) Notice: Subject to any disclaimer, the term of this patent is extended or adjusted under 35 U.S.C. 154(b) by 0 days.

(21) Appl. No.: 15/697,082

(22) Filed: Sep. 6, 2017

(65) Prior Publication Data

US 2018/0067895 A1    Mar. 8, 2018

(30) Foreign Application Priority Data

Sep. 6, 2016    (KR) ........................ 10-2016-0114605

(51) Int. Cl.
| | | |
|---|---|---|
| *G06F 13/42* | (2006.01) | |
| *G06F 9/30* | (2018.01) | |
| *G06F 13/40* | (2006.01) | |
| *G06F 9/38* | (2018.01) | |
| *G06F 15/78* | (2006.01) | |
| *G06F 12/06* | (2006.01) | |
| *G06F 9/445* | (2018.01) | |
| *H03M 7/30* | (2006.01) | |

(52) U.S. Cl.
CPC ............ *G06F 15/7867* (2013.01); *G06F 9/30* (2013.01); *G06F 9/44505* (2013.01); *G06F 12/0646* (2013.01); *G06F 15/7871* (2013.01); *G06F 13/42* (2013.01); *H03M 7/30* (2013.01)

(58) Field of Classification Search
CPC .... G06F 15/7867; G06F 9/30; G06F 9/44505; G06F 12/0646; G06F 15/7871; G06F 13/42; H03M 7/30
USPC ................................................... 365/230.05
See application file for complete search history.

(56) References Cited

U.S. PATENT DOCUMENTS

| | | | |
|---|---|---|---|
| 9,342,478 B2 | 5/2016 | Shim et al. | |
| 9,344,115 B2 | 5/2016 | Cho et al. | |
| 2002/0072893 A1* | 6/2002 | Wilson ................ | G06F 13/1605 703/26 |
| 2003/0120872 A1* | 6/2003 | Aubury ............... | G06F 17/5022 711/141 |

(Continued)

*Primary Examiner* — Ly D Pham
(74) *Attorney, Agent, or Firm* — The Farrell Law Firm, P.C.

(57) ABSTRACT

Methods and apparatuses are provided for compressing configuration data. The configuration data, which includes control data corresponding to at least one processing unit used in each of a plurality of cycles, is stored. A plurality of processing units of a reconfigurable processor is divided into a plurality of groups. The configuration data is partitioned into a plurality of pieces of sub-configuration data. Each piece of sub-configuration data corresponding to a respective one of the plurality of groups. If a plurality of adjacent cycles include identical control data, the configuration data is compressed by deleting control data of all but one of the plurality of adjacent cycles, for each sub-configuration data.

15 Claims, 19 Drawing Sheets

(56) References Cited

U.S. PATENT DOCUMENTS

| | | | |
|---|---|---|---|
| 2010/0211747 A1* | 8/2010 | Shim | G06F 15/7867 |
| | | | 711/147 |
| 2012/0131309 A1* | 5/2012 | Johnson | G06F 9/30 |
| | | | 712/41 |
| 2012/0185675 A1* | 7/2012 | Kim | G06F 9/30072 |
| | | | 712/216 |
| 2015/0127933 A1 | 5/2015 | Choi et al. | |
| 2017/0052818 A1* | 2/2017 | Liu | G06F 15/7871 |

* cited by examiner

FIG. 4A

|   | $FU_0$ | $FU_1$ | $FU_2$ | $FU_3$ | $CU_0$ | $M_{00}$ | $M_{01}$ | $M_{02}$ | $M_{03}$ | $M_{04}$ | $M_{05}$ | $M_{06}$ | $M_{07}$ |
|---|---|---|---|---|---|---|---|---|---|---|---|---|---|
| 0 | add | add | add | – | 7 | 1 | – | – | 0 | – | – | 2 | 1 |
| 1 | add | add | sub | – | 7 | – | 2 | – | 0 | – | 3 | 1 | 1 |
| 2 | add | mul | sub | – | 7 | – | 2 | – | 2 | 3 | 2 | – | 1 |
| 3 | mul | mul | sub | add | – | 0 | 2 | 1 | 2 | 3 | – | – | – |
| 4 | mul | mul | add | add | – | 1 | 0 | 1 | 2 | 3 | 1 | – | – |
| 5 | add | add | add | mul | -5 | 2 | 0 | 3 | – | 2 | 1 | 0 | 0 |
| 6 | add | sub | add | mul | -5 | – | 0 | 3 | 1 | 2 | 0 | 0 | 0 |
| 7 | add | sub | add | mul | -5 | – | 1 | 3 | 1 | 2 | – | 2 | 0 |

FIG. 4B

PARTITION 0 | PARTITION 1 | PARTITION 1 | PARTITION 3
$FU_0$ | $FU_3$ | $CU_0$ | $M_{02}$ | $M_{07}$     $FU_2$ | $M_{01}$     $FU_1$ | $M_{03}$ | $M_{04}$     $M_{00}$ | $M_{05}$ | $M_{06}$

FIG. 4C

| | $FU_0$ | $FU_3$ | $CU_0$ | $M_{02}$ | $M_{07}$ |
|---|---|---|---|---|---|
| 0 | add | – | 7 | – | 1 |
| 1 | add | – | 7 | – | 1 |
| 2 | add | – | 7 | – | 1 |
| 3 | mul | add | – | 1 | – |
| 4 | mul | add | – | 1 | – |
| 5 | add | mul | -5 | 3 | 0 |
| 6 | add | mul | -5 | 3 | 0 |
| 7 | add | mul | -5 | 3 | 0 |

PARTITION 0

| $FU_2$ | $M_{01}$ |
|---|---|
| add | – |
| sub | 2 |
| sub | 2 |
| sub | 2 |
| add | 0 |
| add | 0 |
| add | 0 |
| add | 1 |

PARTITION 1

| $FU_1$ | $M_{03}$ | $M_{04}$ |
|---|---|---|
| add | 0 | – |
| add | 0 | – |
| mul | 2 | 3 |
| mul | 2 | 3 |
| mul | 2 | 3 |
| add | – | 2 |
| sub | 1 | 2 |
| sub | 1 | 2 |

PARTITION 2

| $M_{00}$ | $M_{05}$ | $M_{06}$ |
|---|---|---|
| 1 | – | 2 |
| – | 3 | 1 |
| – | 2 | – |
| 0 | – | – |
| 1 | 1 | – |
| 2 | 1 | 0 |
| – | 0 | 0 |
| – | – | 2 |

PARTITION 3

FIG. 4D

| | $FU_0$ | $FU_3$ | $CU_0$ | $M_{02}$ | $M_{07}$ |
|---|---|---|---|---|---|
| 0 | add | – | 7 | – | 1 |
| 3 | mul | add | – | 1 | – |
| 5 | add | mul | -5 | 3 | 0 |

PARTITION 0

| | $FU_2$ | $M_{01}$ |
|---|---|---|
| 0 | add | – |
| 1 | sub | 2 |
| 4 | add | 0 |
| 7 | add | 1 |

PARTITION 1

| | $FU_1$ | $M_{03}$ | $M_{04}$ |
|---|---|---|---|
| 0 | add | 0 | – |
| 2 | mul | 2 | 3 |
| 5 | add | – | 2 |
| 6 | sub | 1 | 2 |

PARTITION 2

| | $M_{00}$ | $M_{05}$ | $M_{06}$ |
|---|---|---|---|
| 0 | 1 | – | 2 |
| 1 | – | 3 | 1 |
| 2 | – | 2 | – |
| 3 | 0 | – | – |
| 4 | 1 | 1 | – |
| 5 | 2 | 1 | 0 |
| 6 | – | 0 | 0 |
| 7 | – | – | 2 |

PARTITION 3

FIG. 4E

|   | $P_0$ | $P_1$ | $P_2$ | $P_3$ |
|---|---|---|---|---|
| 0 | 1 | 1 | 1 | 1 |
| 1 | 0 | 1 | 0 | 1 |
| 2 | 0 | 0 | 1 | 1 |
| 3 | 1 | 0 | 0 | 1 |
| 4 | 0 | 1 | 0 | 1 |
| 5 | 1 | 0 | 1 | 1 |
| 6 | 0 | 0 | 1 | 1 |
| 7 | 0 | 1 | 0 | 1 |

FIG. 5A

|   | $FU_0$ | $FU_1$ | $FU_2$ | $FU_3$ | $CU_0$ | $M_{00}$ | $M_{01}$ | $M_{02}$ | $M_{03}$ | $M_{04}$ | $M_{05}$ | $M_{06}$ | $M_{07}$ |
|---|---|---|---|---|---|---|---|---|---|---|---|---|---|
| 0 | add | – | add | – | 7 | 1 | – | – | 0 | – | – | 2 | 1 |
| 1 | – | add | – | – | – | – | – | 0 | – | 3 | 1 | 1 | |
| 2 | – | mul | sub | – | – | 2 | – | 2 | 3 | 2 | – | 1 | |
| 3 | mul | – | – | add | – | 0 | 2 | 1 | – | 3 | – | – | – |
| 4 | – | – | add | add | – | 1 | 0 | – | – | – | 1 | – | – |
| 5 | add | add | – | mul | -5 | 2 | 0 | 3 | – | 2 | 1 | 0 | 0 |
| 6 | – | sub | – | – | – | – | – | 1 | – | 0 | 0 | – | |
| 7 | – | – | add | – | – | – | 1 | – | 1 | 2 | – | 2 | – |

FIG. 5C

| | $FU_0$ | $FU_3$ | $CU_0$ | $M_{02}$ | $M_{07}$ |
|---|---|---|---|---|---|
| 0 | add | – | 7 | – | 1 |
| 1 | – | – | – | – | 1 |
| 2 | – | – | – | – | 1 |
| 3 | mul | add | – | 1 | – |
| 4 | – | add | – | – | – |
| 5 | add | mul | -5 | 3 | 0 |
| 6 | – | – | – | – | – |
| 7 | – | – | – | – | – |

PARTITION 0

| $FU_2$ | $M_{01}$ |
|---|---|
| add | – |
| – | – |
| sub | 2 |
| – | 2 |
| add | 0 |
| – | 0 |
| – | – |
| add | 1 |

PARTITION 1

| $FU_1$ | $M_{03}$ | $M_{04}$ |
|---|---|---|
| – | 0 | – |
| add | 0 | – |
| mul | 2 | 3 |
| – | – | 3 |
| – | – | – |
| add | – | 2 |
| sub | 1 | – |
| – | 1 | 2 |

PARTITION 2

| $M_{00}$ | $M_{05}$ | $M_{06}$ |
|---|---|---|
| 1 | – | 2 |
| – | 3 | 1 |
| – | 2 | – |
| 0 | – | – |
| 1 | 1 | – |
| 2 | 1 | 0 |
| – | 0 | 0 |
| – | – | 2 |

PARTITION 3

FIG. 5D

| | FU₀ | FU₃ | CU₀ | M₀₂ | M₀₇ |
|---|---|---|---|---|---|
| 0 | add | – | 7 | – | 1 |
| 1 | add | – | 7 | – | 1 |
| 2 | add | – | 7 | – | 1 |
| 3 | mul | add | – | 1 | – |
| 4 | mul | add | – | 1 | – |
| 5 | add | mul | -5 | 3 | 0 |
| 6 | add | mul | -5 | 3 | 0 |
| 7 | add | mul | -5 | 3 | 0 |

PARTITION 0

| FU₂ | M₀₁ |
|---|---|
| add | – |
| sub | 2 |
| sub | 2 |
| sub | 2 |
| add | 0 |
| add | 0 |
| add | 0 |
| add | 1 |

PARTITION 1

| FU₁ | M₀₃ | M₀₄ |
|---|---|---|
| add | 0 | – |
| add | 0 | – |
| mul | 2 | 3 |
| mul | 2 | 3 |
| mul | 2 | 3 |
| add | – | 2 |
| sub | 1 | 2 |
| sub | 1 | 2 |

PARTITION 2

| M₀₀ | M₀₅ | M₀₆ |
|---|---|---|
| 1 | – | 2 |
| – | 3 | 1 |
| – | 2 | – |
| 0 | – | – |
| 1 | 1 | – |
| 2 | 1 | 0 |
| – | 0 | 0 |
| – | – | 2 |

PARTITION 3

FIG. 5E

| | $FU_0$ | $FU_3$ |
|---|---|---|
| 0 | 1 | 0 |
| 1 | 0 | 0 |
| 2 | 0 | 0 |
| 3 | 1 | 1 |
| 4 | 0 | 1 |
| 5 | 1 | 1 |
| 6 | 0 | 0 |
| 7 | 0 | 0 |

PARTITION 0

| $FU_2$ |
|---|
| 1 |
| 0 |
| 1 |
| 0 |
| 1 |
| 0 |
| 0 |
| 1 |

PARTITION 1

| $FU_1$ |
|---|
| 0 |
| 1 |
| 1 |
| 0 |
| 0 |
| 1 |
| 1 |
| 0 |

PARTITION 2

ELECTRONIC DEVICE, RECONFIGURABLE PROCESSOR AND CONTROLLING METHODS THEREOF

PRIORITY

This application claims priority under 35 U.S.C. § 119(a) to Korean Patent Application No. 10-2016-0114605, filed in the Korean Intellectual Property Office on Sep. 6, 2016, the disclosure of which is incorporated herein by reference.

BACKGROUND

1. Field of the Invention

The present disclosure relates generally an electronic device, a reconfigurable processor, and controlling methods thereof, and more particularly, to an electronic device that processes configuration data, a reconfigurable processor, and controlling methods thereof.

2. Description of the Related Art

Due to the advancement of electronic technology, processors having various architectures have been developed. However, when a specific operation is processed with fixed hardware, it is difficult to flexibly process if there is a slight change in the specific operation. Alternately, it is possible to flexibly process if the specific operation is processed with only software, however, the processing speed is slower than when processing only with a hardware.

Accordingly, a reconfigurable processor that can change a hardware configuration of a device to be optimized for a specific operation rather than a common operation has been developed. Specifically, the reconfigurable processor is beneficial in the field when a specific operation is performed repeatedly.

However, a configuration memory included in the reconfigurable processor covers more than 10% of the area of the processor, and consumes a lot of power.

SUMMARY

The present disclosure has been made to address at least the above problems and/or disadvantages and to provide at least the advantages described below. Accordingly, an aspect of the present disclosure provides an electronic device that compresses, restores, and processes configuration data, a reconfigurable processor, and controlling methods thereof.

According to an embodiment of the present disclosure, an electronic device is provided for compressing configuration data. The electronic device includes a storage, and a processor configured to control the storage to store the configuration data, which comprises control data corresponding to at least one processing unit used in each of a plurality of cycles, divide the plurality of processing units into a plurality of groups, partition the configuration data into a plurality of pieces of sub-configuration data, each piece of sub-configuration data corresponding to a respective one of the plurality of groups, and, if a plurality of adjacent cycles include identical control data, compress the configuration data by deleting control data of all but one of the plurality of adjacent cycles, for each sub-configuration data.

According to another embodiment of the present disclosure, a reconfigurable processor is provided for restoring and processing configuration data. The reconfigurable processor includes a plurality of processing units, a buffer register configured to transmit control data to the plurality of processing units, and an inputter configured to receive compression configuration data, which includes a plurality of pieces of sub-configuration data and compression information of the compression configuration data. The reconfigurable processor also includes a configuration memory configured to store the compression configuration data. Each of the plurality of pieces of sub-configuration data includes control data corresponding to at least one processing unit used in at least one cycle, respectively, and control data of all but one of a plurality of adjacent cycles including identical control data is removed. The reconfigurable processor determines a reference cycle of a current cycle for each of the plurality of pieces of sub-configuration data based on the compression information, and stores control data included in the reference cycle in the current cycle in the buffer register.

According to another embodiment of the present disclosure, a method of an electronic device is provided for compressing configuration data. The configuration data, which includes control data corresponding to at least one processing unit used in each of a plurality of cycles, is stored. A plurality of processing units of a processor is divided into a plurality of groups. The configuration data is partitioned into a plurality of pieces of sub-configuration data. Each piece of sub-configuration data corresponding to a respective one of the plurality of groups. If a plurality of adjacent cycles include identical control data, the configuration data is compressed by deleting control data of all but one of the plurality of adjacent cycles, for each sub-configuration data.

According to another embodiment of the present disclosure, a method of a reconfigurable processor is provided for restoring and processing configuration data is provided. Compression configuration data, which includes a plurality of pieces of sub-configuration data and compression information of the compression configuration data, is received. The compression configuration data is stored in the configuration memory. A reference cycle of a current cycle is determined for each of the plurality of pieces of sub-configuration data based on the compression information, and control data included in the reference cycle is stored in the current cycle in the buffer register. Control data stored in the buffer register is transmitted to the plurality of processing units. Each of the plurality of pieces of sub configuration data includes control data corresponding to at least one processing unit used in at least one cycle, respectively, and control data of all but one of a plurality of adjacent cycles including identical control data is removed.

BRIEF DESCRIPTION OF THE DRAWINGS

The above and other aspects, features, and advantages of the present disclosure will be more apparent from the following detailed description when taken in conjunction with the accompanying drawings, in which:

FIGS. 4A to 4E are tables showing a method of compressing configuration data of an electronic device, according to an embodiment of the present disclosure;

FIGS. 5A to 5E are tables showing a method of compressing configuration data of an electronic device, according to another embodiment of the present disclosure;

DETAILED DESCRIPTION

Figure 1:
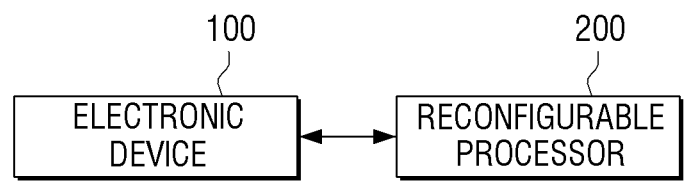
FIG. 1 is a diagram illustrating an electronic device and a reconfigurable processor, according to an embodiment of the present disclosure.

Embodiments of the present disclosure are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the present disclosure.

If it is described that a certain element (e.g., first element) is "operatively or communicatively coupled with/to" or is "connected to" another element (e.g., second element), it should be understood that the certain element may be connected to the other element directly or through still another element (e.g., third element). To the contrary, it will be understood that when an element (for example, a first element) is "directly coupled with/to" or "directly connected to" another element (for example, a second element), there is no intervening element (for example, a third element) between the element and the other element.

The terms used in various embodiments of the present disclosure are for the purpose of describing particular embodiments and are not intended to limit the present disclosure. In addition, a singular expression does not limit the present disclosure to have a single component or step. Instead, the present disclosure may comprise multiple components or steps even if described in singular expression. All of the terms used herein including technical or scientific terms have the same meanings as those generally understood by an ordinary skilled person in the related art unless they are defined otherwise. The terms defined in a generally used dictionary should be interpreted as having the same meanings as the contextual meanings of the relevant technology and should not be interpreted as having ideal or exaggerated meanings unless they are clearly defined in the various embodiments. According to circumstances, even the terms defined in the embodiments herein should not be interpreted as excluding embodiments of the present disclosure.

Hereinafter, various embodiments of the present disclosure are described in detail with reference to the accompanying drawings.

FIG. 1 is a diagram illustrating an electronic device and a reconfigurable processor, according to an embodiment of the present disclosure.

An electronic device 100 may compress configuration data and provide the compressed configuration data to a reconfigurable processor 200. Here, the configuration data is a data used in the reconfigurable processor 200 including a plurality of processing units, and may be data to control the plurality of processing units included in the reconfigurable processor 200 by cycle.

The electronic device 100 may perform compiling. For example, the electronic device 100 may convert high-level language to a language that the reconfigurable processor 200 can directly understand so that a program written in the high-level language can be performed in the reconfigurable processor 200.

Specifically, the electronic device 100 may perform conventional compiling, generate configuration data in which control data corresponding to at least one processing unit, which is used in each of a plurality of cycles, is listed, and store the generated configuration data. However, the electronic device 100 is not limited thereto, and may receive configuration data in which compiling is already performed, and only compress the data.

As described above, the control data is listed in the configuration data, but the configuration data may include No Operation (NOP) data etc. regarding a function unit among a plurality of processing units, in addition to the control data. For example, the configuration data may include NOP data, which prevents a function unit from operating, in addition to control data, which makes a function unit among a plurality of processing units perform ADD calculation. The configuration data may further include data that prevents a constant unit, a multiplexer, and a register file among the plurality of processing units from operating. The control data may include data that prevents a constant unit, a multiplexer, and a register file from operating, in addition to NOP data.

The electronic device 100 may divide a plurality of processing units included in the configuration data into a plurality of groups. For example, the electronic device 100 may divide the plurality of processing units included in the configuration data into a first group that includes a function unit, and a second group that includes the remaining processing units. However, the electronic device 100 may divide the plurality of processing units into other groups as well. Specifically, the electronic device 100 may group different types of processing units.

Hereinafter, it is described that the electronic device 100 divides a plurality of processing units into a plurality of groups according to a predetermined method. The predetermined method is described in greater detail below after the compressing method.

The electronic device 100 may partition configuration data into a plurality of pieces of sub configuration data corresponding to each of a plurality of groups. If a plurality of adjacent cycles include the same control data, the electronic device 100 may compress configuration data by deleting control data of all cycles except for one of the plurality of adjacent cycles, for each sub configuration data, which is described in greater detail below.

The reconfigurable processor 200 may be included in an apparatus separate from the electronic device 100. For example, the electronic device 100 may generate compression configuration data by compiling control data corresponding to at least one processing unit used in each of a plurality of cycles, and the apparatus, which includes the reconfigurable processor 200, may execute compiled compression configuration data. Hereinafter, for convenience of explanation, the reconfigurable processor 200 is described instead of an entire apparatus including the reconfigurable processor 200.

The reconfigurable processor 200 may be provided and store compression configuration data from the electronic device 100. Here, the reconfigurable processor 200 may receive compression configuration data, and a physical size of configuration memory included in the reconfigurable processor 200 may be smaller than a case in which configuration data that is not compressed is received. In addition, as size of data is reduced, power consumption may be reduced. Alternatively, if a size of the configuration memory remains the same, data that is able to be loaded into the configuration memory may increase.

The configuration memory of the reconfigurable processor 200 may be divided to correspond to a partitioning of configuration data in the electronic device 100. A plurality of processing units, a buffer register and an inputter included in the reconfigurable processor 200 may be linked to each other to correspond to a compressing method of the electronic device 100. Specifically, the reconfigurable processor 200 may be designed in hardware to correspond to the compressing method of the electronic device 100.

The reconfigurable processor 200 may restore and process compression configuration data, which is described in greater detail below after a compressing method of the electronic device 100.

Figure 2:
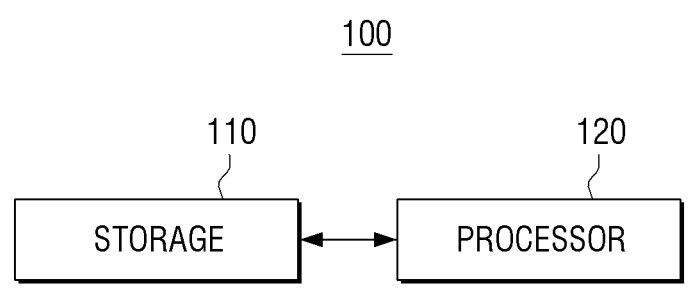
FIG. 2 is a block diagram illustrating a configuration of an electronic device, according to an embodiment of the present disclosure.

FIG. 2 is a block diagram illustrating a configuration of an electronic device, according to an embodiment of the present disclosure.

As illustrated in FIG. 2, the electronic device 100 includes a storage 110 and a processor 120.

The storage 110 may store configuration data in which control data corresponding to at least one processing unit used in each of a plurality of cycles is listed. The configuration data stored in the storage 110 may be data in which compiling is completed. That is, a scheduling is completed for the configuration data stored in the storage 110, and the scheduled configuration data may include information regarding operations by cycle of each of a plurality of processing units.

In addition, the storage 110 may store a compressing method of configuration data. The compressing method of configuration data may correspond to a hardware feature of the reconfigurable processor 200. For example, the compressing method of configuration data may be changed according to an arrangement and wiring of a plurality of processing units in the reconfigurable processor 200.

The processor 120 may divide the plurality of processing units included in the configuration data into a plurality of groups, partition the configuration data into a plurality of pieces of sub configuration data corresponding to each of the plurality of groups, and, if a plurality of adjacent cycles include the same control data for each sub configuration data, compress the configuration data by deleting control data of all cycles except for one of the plurality of cycles.

Alternatively, if all control data of a first cycle is the same as a part of control data of a second cycle adjacent to the first cycle, for each sub configuration data, the processor 120 may update control data of the first cycle of at least one processing unit corresponding to the remaining control data of the second cycle to be the same as the remaining control data of the second cycle, and compress the configuration data by deleting any one of control data of the first cycle and the second cycle.

The processor 120 may generate valid information for a valid processing unit in each of at least one cycle included in the configuration data. The processor 120 may transmit the generated valid information and the compressed configuration data to the reconfigurable processor 200.

For each of the plurality of pieces of sub configuration data, the processor 120 may generate compression information, which includes information regarding whether control data included in each cycle is removed. The processor 120 may transmit the generated compression information and the compressed configuration data to the reconfigurable processor 200.

The plurality of processing units may include at least one of at least one function unit, at least one constant unit, at least one multiplexer, and at least one register file.

Figure 3:
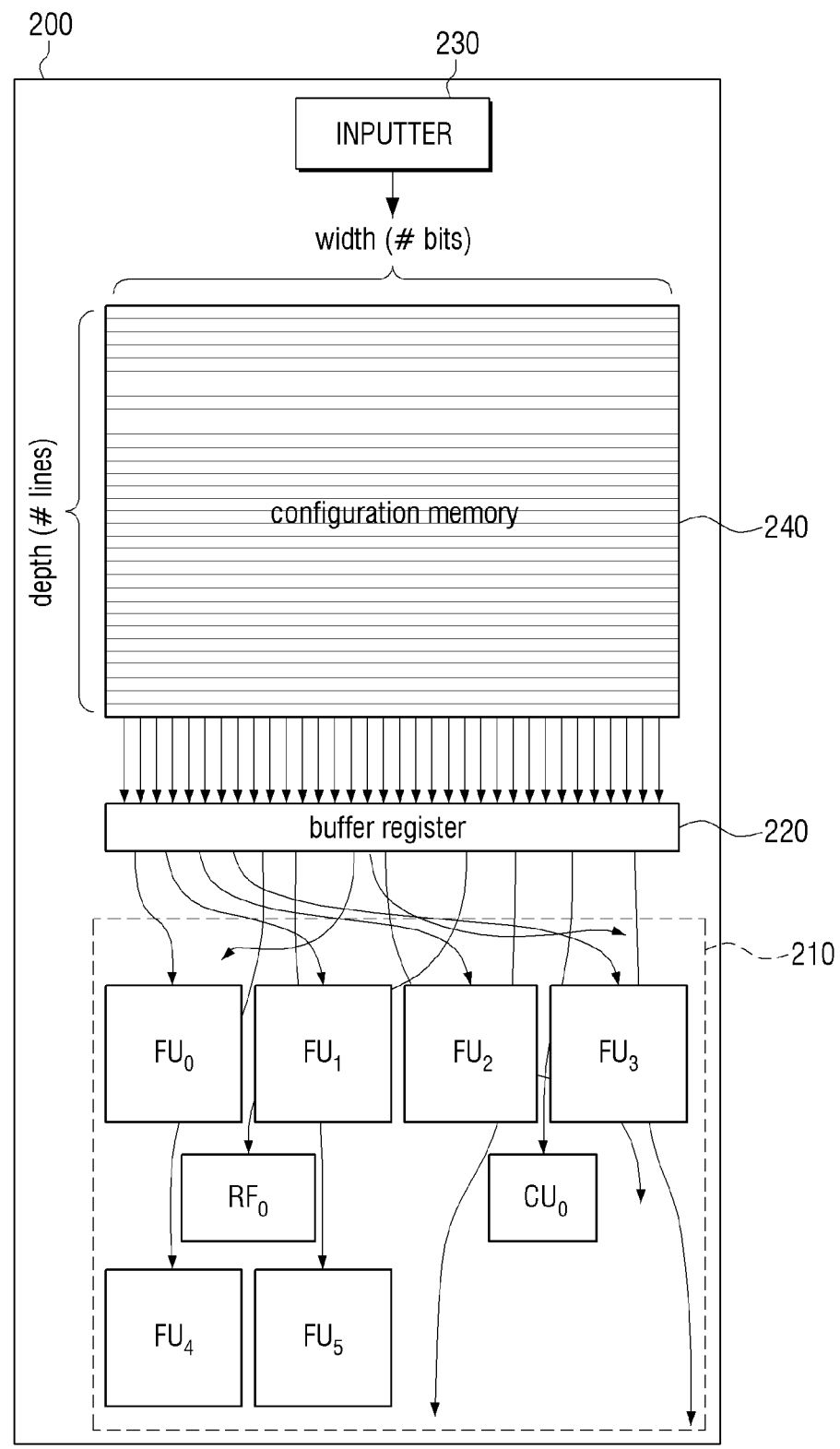
FIG. 3 is a diagram illustrating a configuration of a reconfigurable processor, according to an embodiment of the present disclosure.

FIG. 3 is a diagram illustrating a configuration of a reconfigurable processor, according to an embodiment of the present disclosure.

As illustrated in FIG. 3, a reconfigurable processor 200 includes a plurality of processing units 210, a buffer register 220, an inputter 230, and a configuration memory 240.

The plurality of processing units 210 may include at least one of at least one function unit, at least one constant unit, at least one multiplexer, and at least one register file. However, the plurality of processing units 210 is not limited thereto, and may further include at least one register file and a controlling unit, etc.

A function unit may be a configuration to perform a predetermined calculation in the reconfigurable processor 200. For example, the function unit may be a configuration to perform an add operation in the reconfigurable processor 200. However, the function unit is not limited thereto, and may perform other calculations in addition to the add operation and may perform a plurality of calculations.

Generally, the reconfigurable processor 200 may include sixteen function units. However, the reconfigurable processor 200 is not limited thereto, and may include a different number of function units.

In addition, a plurality of function units included in the reconfigurable processor 200 may be different from each other. For example, a first function unit in the reconfigurable processor 200 may perform only an add operation, but a second function unit may perform a multiplying operation in addition to the add operation. However, the plurality of function units is not limited thereto, and may all be the same.

A constant unit outputs a constant. For example, the constant unit may output a constant such as 7.

A multiplexer may output any one of a plurality of pieces of input data received from a plurality of input ports. For example, the multiplexer may include 4 input ports, 0, 1, 2 and 3, and may output input data received from the input port '1'. If a cycle is changed, the multiplexer may output input data received from an input port other than the input port '1'.

The multiplexer may be used to provide input data of another processing unit. For example, the multiplexer may be included among a function unit and a plurality of configurations, and provide only one of a plurality of pieces of input data received from the plurality of configurations to the function unit.

The buffer register 220 may transmit control data to a plurality of process units 210. For example, the buffer register 220 may transmit addition control data to the first function unit, transmit 5 to a first constant unit, and transmit data to output data input to the input port '3' to a first multiplexer. The buffer register 220 may store control data until performing the above process.

The buffer register 220 may receive control data from the configuration memory 240 and store the control data. The buffer register 220 may synchronize control data received from the configuration memory 240 and transmit the synchronized control data to the plurality of processing units

210. For example, the buffer register 220 may receive a plurality of pieces of control data from the configuration memory 240, but the time for which the plurality of pieces of control data are received may vary. However, the buffer register 220 may simultaneously output a plurality of pieces of control data input from one of rising edge or descending edge of a clock signal. Accordingly, the plurality of processing units 210 may receive control data simultaneously.

The inputter 230 may receive compression configuration data including a plurality of pieces of sub configuration data and compression information of the compression configuration data from an external configuration of the reconfigurable processor 200. For example, the inputter 230 may receive compression configuration data and compression information through wireless communication from the electronic device 100. Alternatively, the inputter 230 may receive compression configuration data and compression information from memory connected to the reconfigurable processor 200.

Each of the plurality of pieces of sub configuration data includes control data corresponding to at least one processing unit used in each of at least one cycle, as control data of all cycles except for one of a plurality of adjacent cycles having the same control data is removed.

The configuration memory 240 may store compression configuration data input through the inputter 230. The configuration memory 240 may store the compression configuration data by each cycle, and one cycle may form one depth. However, the compression configuration data includes a plurality of pieces of sub configuration data, and entire cycle of the plurality of pieces of sub configuration data may be different from each other. That is, a depth of the configuration memory 240 may be different according to each of the plurality of pieces of sub configuration data.

The configuration memory 240 may store a bit string to control the plurality of processing units 210 based on width.

In FIG. 3, a configuration of the reconfigurable processor 200 has been described, and a detailed operation will be described in greater detail below. A method to compress configuration data is first described, followed by a method to restore compression configuration data.

FIGS. 4A to 4E are tables showing a method of compressing configuration data of the electronic device 100, according to an embodiment of the present disclosure.

FIG. 4A is a table showing configuration data, according to an embodiment of the present disclosure. The configuration data of FIG. 4A is in a scheduling complete state, and may include information regarding operations by cycle for each of the plurality of function units 210.

Specifically, the configuration data may include information regarding an operation during 8 cycles for each of 4 function units, one constant unit, and 8 multiplexers. However, a type of processing unit, the number of processing units, and the number of cycles included in the processing unit may vary.

The processor 120 may divide a plurality of processing units included in the configuration data into a plurality of groups. Each of the plurality of groups may include at least one processing unit.

For example, the processor 120 may divide a plurality of processing units included in the configuration data into a plurality of groups, partition 0, partition 1, partition 2 and partition 3 as illustrated in FIG. 4B.

FIG. 4B is a table showing that a plurality of processing units included in configuration data are divided into 4 groups, but it is only an embodiment, and the processing units may be divided into a different number of groups. In addition, a different combination of processing units may be included in each group.

As illustrated in FIG. 4C, the processor 120 may partition configuration data into a plurality of pieces of sub configuration data corresponding to each of the plurality of groups. According to this, each of partition 0, partition 1, partition 2 and partition 3 may include operation information for each cycle of corresponding processing unit. Here, the sub configuration data and the partition are the same concept, and thus, is used interchangeably below.

As illustrated in FIG. 4D, if a plurality of adjacent cycles include the same control data, the processor 120 may compress configuration data by deleting control data of all cycles except for one of the plurality of adjacent cycles, for each sub configuration data. For example, examining partition 0 of FIG. 4C, a processing unit included in partition 0 performs the same operation during 2 cycles from 0-th cycle. Accordingly, the processor 120 may store control data of the 0-th cycle only, and delete control data of a first and a second cycles.

The processor 120 may perform the above processes for all cycles of entire sub configuration data. As illustrated in FIG. 4D, the processor 120 may store only information during 3 cycles, 4 cycles, 4 cycles, and 8 cycles for each of partition 0, partition 1, partition 2, and partition 3. That is, the processor 120 may compress data by approximately the shaded part of FIG. 4D.

The processor 120 may provide compression configuration data as in FIG. 4D to the reconfigurable processor 200. However, in order for the reconfigurable processor 200 to restore the compression configuration data, as illustrated in FIG. 4E, the processor 120 may generate compression information including information regarding whether control data included in each cycle is deleted for each of the plurality of pieces of sub configuration data.

For example, the processor 120 may generate 1 for the o-th cycle in which the control data is not deleted in partition 0, and 0 for the first and second cycles in which the control data is deleted in partition 0 as compression information. Through the above method, the processor 120 may generate compression information on all cycles of each partition as in FIG. 4E.

In FIG. 4B, a method for dividing a plurality of processing units into a plurality of groups may be predetermined. For example, the predetermined method may be decided statistically. In detail, the processor 120 may partition the configuration data in various ways. In addition, the processor 120 may calculate an optimum partitioning method by calculating compression ratio according to each method.

The processor 120 may partition each of a plurality of pieces of configuration data other than one configuration data in various methods. Accordingly, the processor 120 may decide a partitioning method that has an optimum compression ratio.

When the partitioning method is decided through the above operation, the processor 120 may compress new configuration data by the decided partitioning method. Here, the decided partitioning method may be not an optimum method. However, it is likely that the determined partitioning method is the optimal method for the configuration data.

FIGS. 5A to 5E are tables showing a method of compressing configuration data of an electronic device, according to another embodiment of the present disclosure.

FIG. 5A is a table showing configuration data, according to another embodiment of the present disclosure. Configuration data of FIG. 5A is in a state in which scheduling is completed, and may include information regarding operations by cycle for each of the plurality of function units 210. The configuration data of FIG. 5A is similar to that of FIG. 4A, but is different in some operations for each cycle.

Figure 5B:
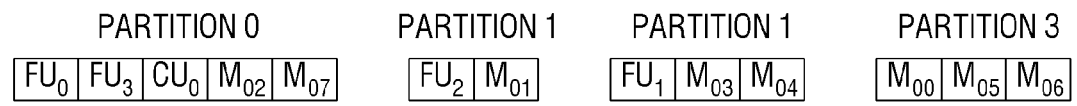

As illustrated in FIG. 5B, the processor 120 may divide a plurality of processing units included in the configuration data into a plurality of groups of partition 0, partition 1, partition 2, and partition 3, according to a predetermined method. It is assumed that the predetermined method is identical to that of FIG. 4B.

As illustrated in FIG. 5C, the processor 120 may partition the configuration data into a plurality of pieces of sub configuration data corresponding to each of a plurality of groups. However, unlike FIG. 4C, it may be less likely that a plurality of adjacent cycles include the same control data. In this case, the processor 120 may perform an additional operation to improve a compression ratio.

Specifically, for each sub configuration data, if entire control data of the first cycle is the same as some of control data of the second cycle adjacent to the first cycle, the processor 120 updates control data of the first cycle of at least one processing unit corresponding to remaining control data of the second cycle to be the same as remaining control data of the second cycle, and compresses the configuration data by deleting any one of control data of the first cycle and the second cycle. Here, the first cycle may indicate one of a plurality of cycles.

For example, with regard to partition 0 of FIG. 5C, only operations of a seventh multiplexer of the first and the second cycles are the same as the operation of the 0-th cycle, and remaining processing units of the first and the second cycles are not used. In this case, the processor 120 may update an operation of the remaining processing units in the 0-th cycle to operate the same in the first and the second cycles as well.

In other words, as in FIG. 5D, the processor 120 may update the operations of the 0-th function unit and the 0-th constant unit in the first and the second cycles to be the same as the operation of the 0-th cycle. The above described operations may be performed for every cycle of each sub configuration data, and a shaded part of FIG. 5D indicates an updated cycle.

However, if at least one piece of control data of adjacent cycles is different from the others, such as partition 3 of FIG. 5D, the processor 120 may not perform the above described operation.

The table of FIG. 5D is the same as that of FIG. 4C, and an operation of deleting control data of all cycles except for one of a plurality of adjacent cycles, if the plurality of adjacent cycles include the same control data, for each sub configuration data, and an operation of generating compression information, are the same as that of FIG. 4C.

That is, the processor 120 may convert data so a plurality of adjacent cycles include the same control data. Accordingly, compression effectiveness may be improved. However, in order for the reconfigurable processor 200 to restore compression configuration data, as illustrated in FIG. 5E, the processor 120 may generate valid information for a valid processing unit in each of at least one cycle included in the configuration data. Here, the processor 120 may generate valid information for each of a plurality of pieces of sub configuration data.

For example, the processor 120 may generate 1 for a valid processing unit and 0 for an invalid processing unit updated from an adjacent cycle, as valid information. Referring to FIG. 5C, 0-th cycle of 0-th function unit is a processing unit valid as an add operation, and thus 1 is generated, and the first cycle of the 0-th function unit is a processing unit invalid as NOP data, and thus 0 is generated.

Through the above-described method, the processor 120 may generate valid information for each of the plurality of pieces of sub configuration data. Valid information for each of the plurality of pieces of sub configuration data may include valid information for each cycle of each processing unit.

Here, the valid information requires 1 bit of information because the valid information can be expressed as 0 or 1, but control data generally requires more bits than the valid information. Accordingly, compression effectiveness may be improved.

The processor 120 may provide compression configuration data, compression information, and valid information to the reconfigurable processor 200. A method of restoring compression configuration data of the reconfigurable processor 200 is described in greater detail below.

Figure 6A:
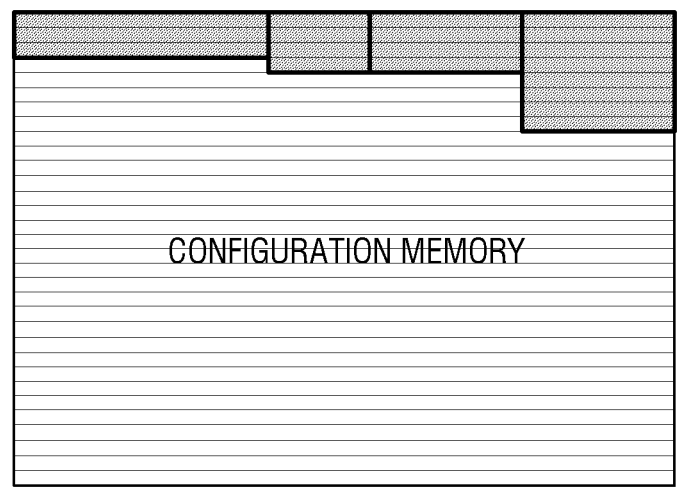
FIGS. 6A to 6C are diagrams illustrating a method of restoring compression configuration data of a reconfigurable processor, according to an embodiment of the present disclosure.
Figure 6B:
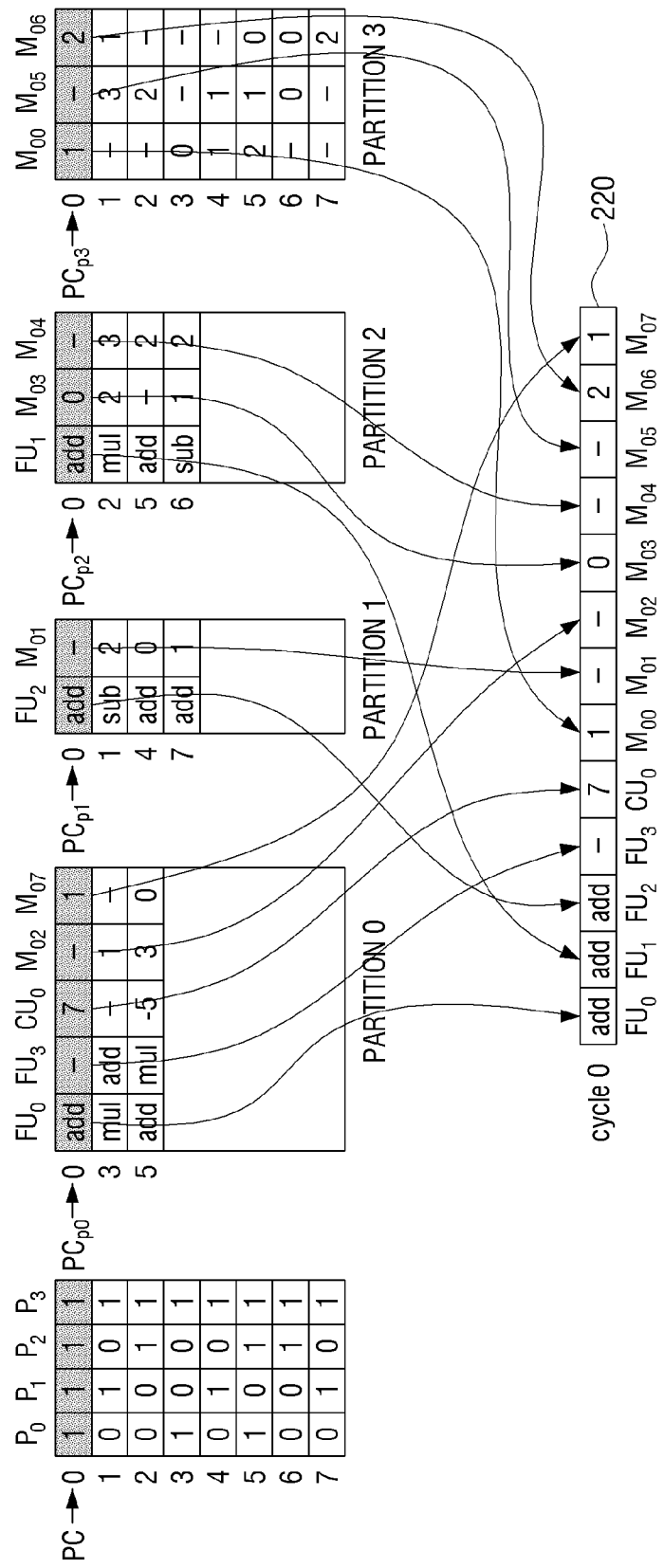
Figure 6C:
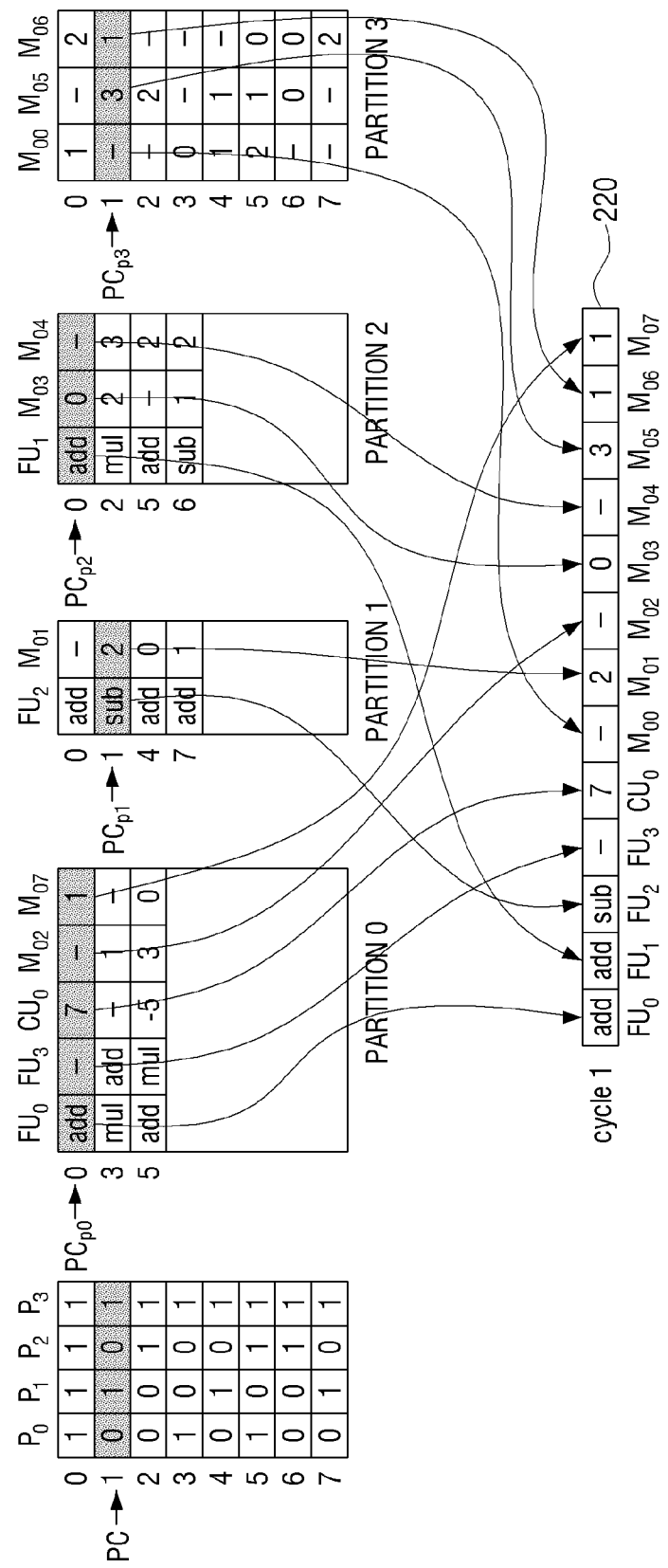

FIGS. 6A to 6C are diagrams illustrating a method of restoring compression configuration data of a reconfigurable processor, according to an embodiment of the present disclosure.

First, as illustrated in FIG. 6A, the configuration memory 240 may store compression configuration data provided from the electronic device 100. Here, it is assumed that the compression configuration data is data of FIG. 4D.

The configuration memory 240 is illustrated as one configuration in FIG. 6A, but it is merely an embodiment, and the configuration memory 240 may be an assembly of a plurality of memories corresponding to a plurality of pieces of sub configuration data of the compression configuration data. That is, the configuration memory 240 may be configured as a plurality of memories to correspond to each of a plurality of partitions divided by the electronic device 100.

As illustrated in FIGS. 6B and 6C, the reconfigurable processor 200 determines a reference cycle of a current cycle for each of the plurality of pieces of sub configuration data based on the compression information, and stores control data included in the determined reference cycle in the current cycle in the buffer register 220.

Here, the compression information may include information regarding whether control data is deleted, and the control data which is included in each cycle, for each of the plurality of pieces of sub configuration data. The compression information may be stored in a separate register, and not in the configuration memory 240. In this case, the reconfigurable processor 200 may additionally include the separate register to store the compression information. However, embodiments of the present disclosure are not limited thereto, and the compression information may be stored in the configuration memory 240.

The reconfigurable processor 200 determines a reference cycle of a current cycle for each of the plurality of pieces of sub configuration data based on the compression information, and stores control data included in the determined reference cycle in the current cycle in the buffer register 220. In the process of determining the reference cycle, a plurality of memories may be used.

In other words, separately from the buffer register 220 and the configuration memory 240, the reconfigurable processor 200 may further include a plurality of memories storing information regarding a memory address in which control data corresponding to the current cycle is read from each of the plurality of pieces of sub configuration data.

Here, the plurality of memories store information regarding the memory address, not the memory address itself. For example, if information stored in the memory is 0, the reconfigurable processor 200 may read control data in a memory address corresponding to 0. That is, the reconfigurable processor 200 may detect a memory address from information regarding the memory address.

However, embodiments of the present disclosure are not limited thereto, and the plurality of memories may store memory address itself, not the information regarding the memory address.

The reconfigurable processor 200 updates information stored in each of the plurality of memories based on the compression information, reads control data corresponding to the current cycle from the configuration memory 240 based on information stored in memory corresponding to each of the plurality of pieces of sub configuration data, and stores the read control data in the buffer register 220.

Here, information regarding a memory address in which control data corresponding to the current cycle to be read is a flag indicating the memory address. Here, the flag may be expressed as depth information of a configuration memory or a program counter PC information.

The reconfigurable processor 200 maintains a current flag value if the current cycle is removed, and changes a current flag value if the current cycle is not removed.

For example, as in FIG. 6B, if the current cycle is cycle 0, the reconfigurable processor 200 determines that the 0-th cycle of partition 0 is not removed because compression information of the 0-th cycle of partition 0 is 1, and stores control data of the first cycle of partition 0 stored in the configuration data in the buffer register 220.

Since compression information of the 0-th cycle is 1 regardless of a partition, the reconfigurable processor 200 may store control data of the first cycle of all partitions stored in the configuration data in the buffer register 220.

Here, the reconfigurable processor 200 may update a plurality of memory values to compression information 1 of the 0-th cycle.

As in FIG. 6C, if the current cycle is changed from cycle 0 to cycle 1, the reconfigurable processor 200 determines that the first cycle of partition 0 is removed because compression information of the first cycle of partition 0 is 0, and stores control data of the first cycle of partition 0 stored in the configuration data in the buffer register 220.

In other words, the reconfigurable processor 200 may determine that control data of the 0-th cycle and the first cycle of partition 0 are the same, and use control data of the first cycle of partition 0 stored in configuration data once again.

Here, the reconfigurable processor 200 may perform an add operation for compression information and information stored in a corresponding memory. That is, the reconfigurable processor 200 may perform an add operation for compression information 0 of the first cycle of partition 0 and flag 1 of the corresponding memory.

Accordingly, a memory corresponding to partition 0 in the first cycle may maintain value 1.

If the current cycle is changed from cycle 0 to cycle 1, the reconfigurable processor 200 determines that the first cycle of partition 1 is not removed because compression information of the first cycle of partition 1 is 1, and stores control data of the second cycle of partition 1 stored in the configuration data in the buffer register 220.

That is, the reconfigurable processor 200 may determine that control data of the 0-th cycle and the first cycle of partition 1 are not the same, and read control data of the second cycle of partition 1 stored in configuration data.

Here, the reconfigurable processor 200 may perform an add operation for compression information 1 of the first cycle of partition 1, and flag 1 of corresponding memory. Accordingly, control data may be updated to a value of 2 of memory corresponding to partition 1, in the first cycle.

By repeating the above process, the reconfigurable processor 200 may read control data corresponding to the current cycle from the configuration memory 240 based on information stored in memory corresponding to each of the plurality of pieces of sub configuration data, and stores the read control data in the buffer register 220.

Figure 7:
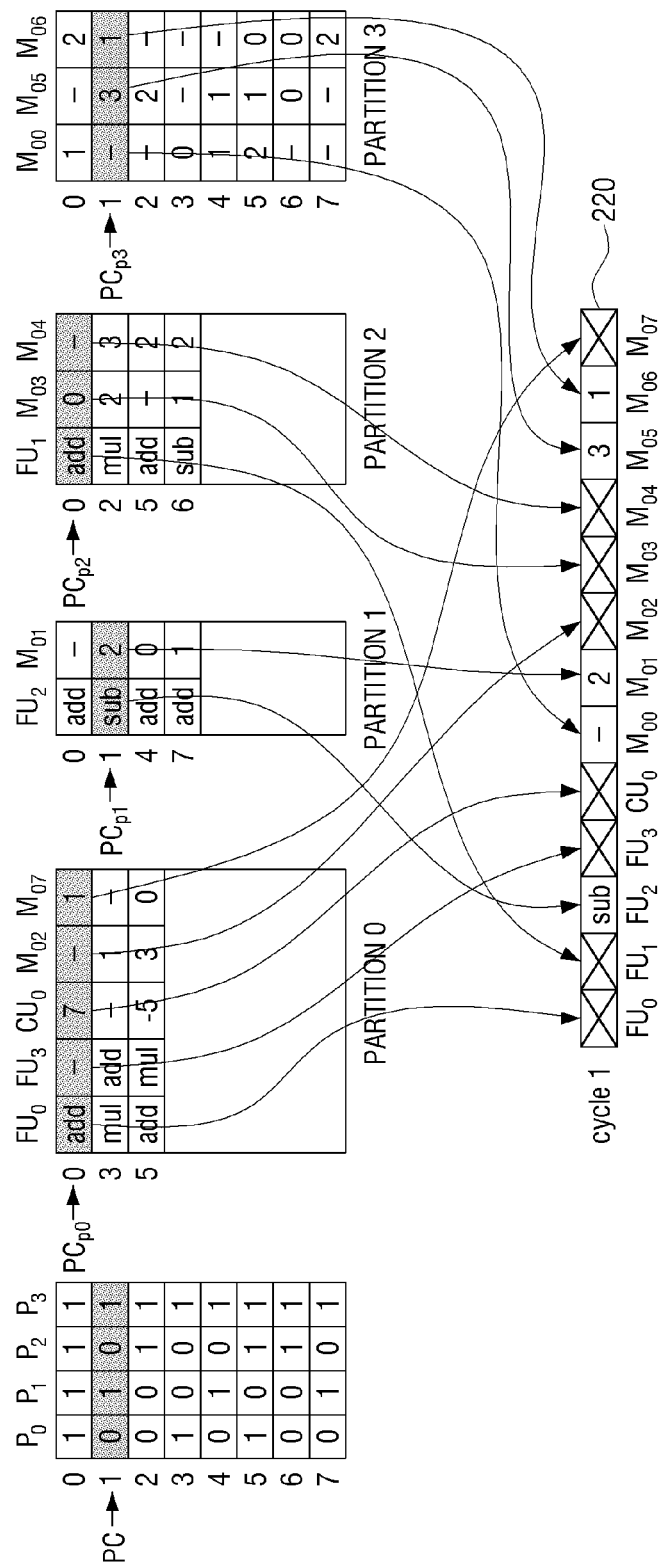
FIG. 7 is a diagram illustrating a method of restoring compression configuration data of a reconfigurable processor, according to another embodiment of the present disclosure.

FIG. 7 is a diagram illustrating a method of restoring compression configuration data of a reconfigurable processor, according to another embodiment of the present disclosure.

The inputter 230 may receive valid information regarding a processing unit valid in at least one cycle, which is included in the compression configuration data. Here, the valid information is the same as described in FIG. 5E.

The reconfigurable processor 200 determines a processing unit valid in the current cycle based on the received valid information, and stores control data corresponding to the valid processing unit among control data included in the determined reference cycle in the buffer register 220 in a current cycle.

First, valid information, which is the same as that of FIG. 5E, is input. In FIG. 5E, 1 may be a valid processing unit, and 0 may be an invalid processing unit.

As described in FIG. 6B, FIG. 7 is a diagram illustrating that the reconfigurable processor 200 determines a reference cycle of the current cycle for each of the plurality of pieces of sub configuration data based on the compression information, and stores the control data included in the reference cycle determined in the current cycle in the buffer register 220.

Here, if the current cycle is cycle 1, the reconfigurable processor 200 may store control data only corresponding to the seventh multiplexer, the first function unit, the third multiplexer, the fifth multiplexer, and the sixth multiplexer, which are valid processing units, based on the first cycle of the valid information, in the buffer register 220.

That is, as illustrated in FIG. 7, the configuration memory 240 includes data, and there may be data that is not input to the buffer register 220 even though the data is referenced.

In FIG. 7, it is described that only some data of the configuration memory 240 is stored in the buffer register 220 according to valid information, but it is not limited thereto. For example, the reconfigurable processor 200 may provide corresponding valid information to each function unit, and control to determine whether to operate the function unit based on the valid information. Specifically, if 1 is input to the first function unit, the function unit operates based on the input control data, and if 0 is input to the first function unit, the function unit may not operate regardless of whether the control data is input.

Figure 8:
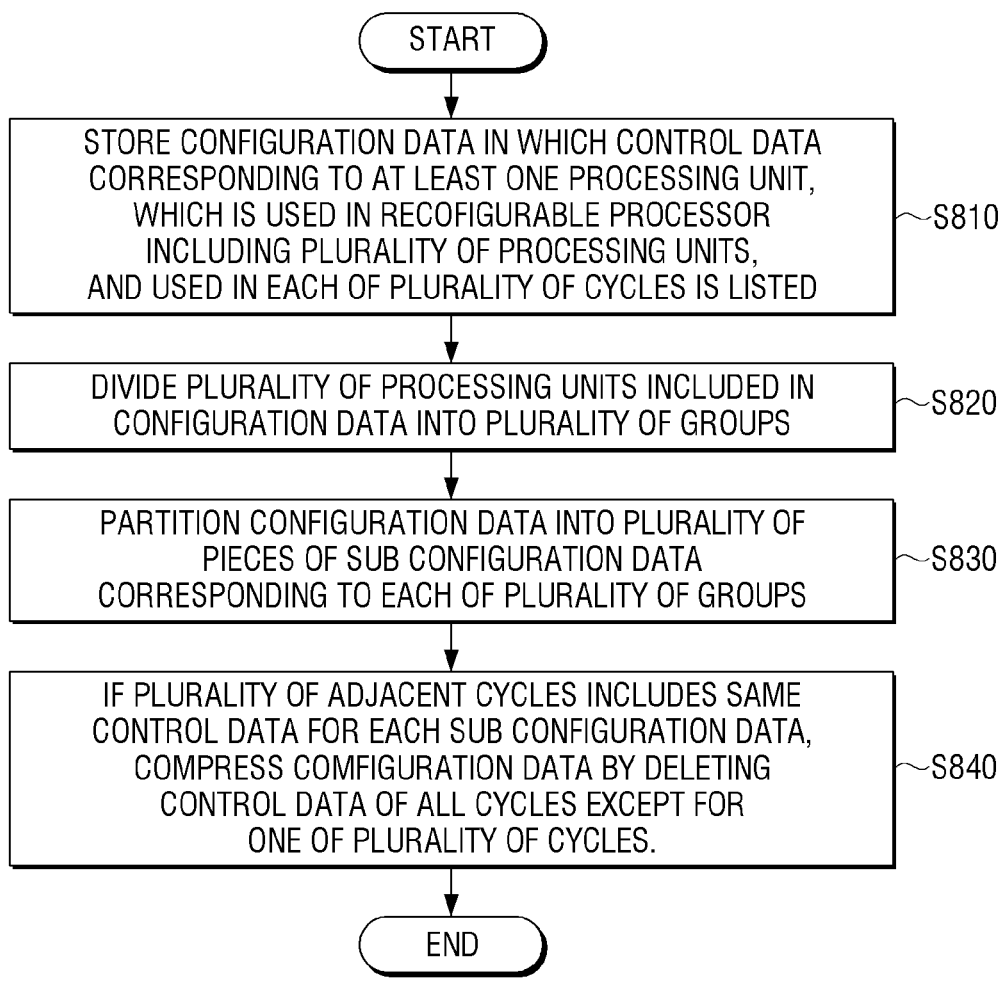
FIG. 8 is a flowchart illustrating a method of controlling an electronic device, according to an embodiment of the present disclosure.

FIG. 8 is a flowchart illustrating a method of controlling an electronic device, according to an embodiment of the present disclosure.

First, configuration data in which control data corresponding to at least one processing unit, which is used in the reconfigurable processor including a plurality of processing units, and which is used in each of a plurality of cycles, is listed is stored, at operation S810. A plurality of processing units included in the configuration data are divided into a plurality of groups, at operation S820. The configuration data is partitioned into a plurality of pieces of sub configuration data corresponding to each of the plurality of groups, at operation S830. For each sub configuration data, if a plurality of adjacent cycles include the same control data, configuration data is compressed by deleting control data of all cycles except for one of the plurality of adjacent cycles, at operation S840.

For each sub configuration data, if all control data of a first cycle is the same as some of control data of a second cycle adjacent to the first cycle, control data of the first cycle of at least one processing unit corresponding to remaining control data of the second cycle is updated to be the same as remaining control data of the second cycle, and the compressing of operation S840 may compress the configuration data by deleting any one of the control data of the first cycle and the second cycle.

Generating valid information for a valid processing unit in each of at least one cycle included in the configuration data may also be included.

Generating compression information including information regarding whether control data included in each cycle is deleted for each of the plurality of pieces of sub configuration data may further be included.

The plurality of processing units include at least one of at least one function unit, at least one constant unit, at least one multiplexer, and at least one register file.

Figure 9:
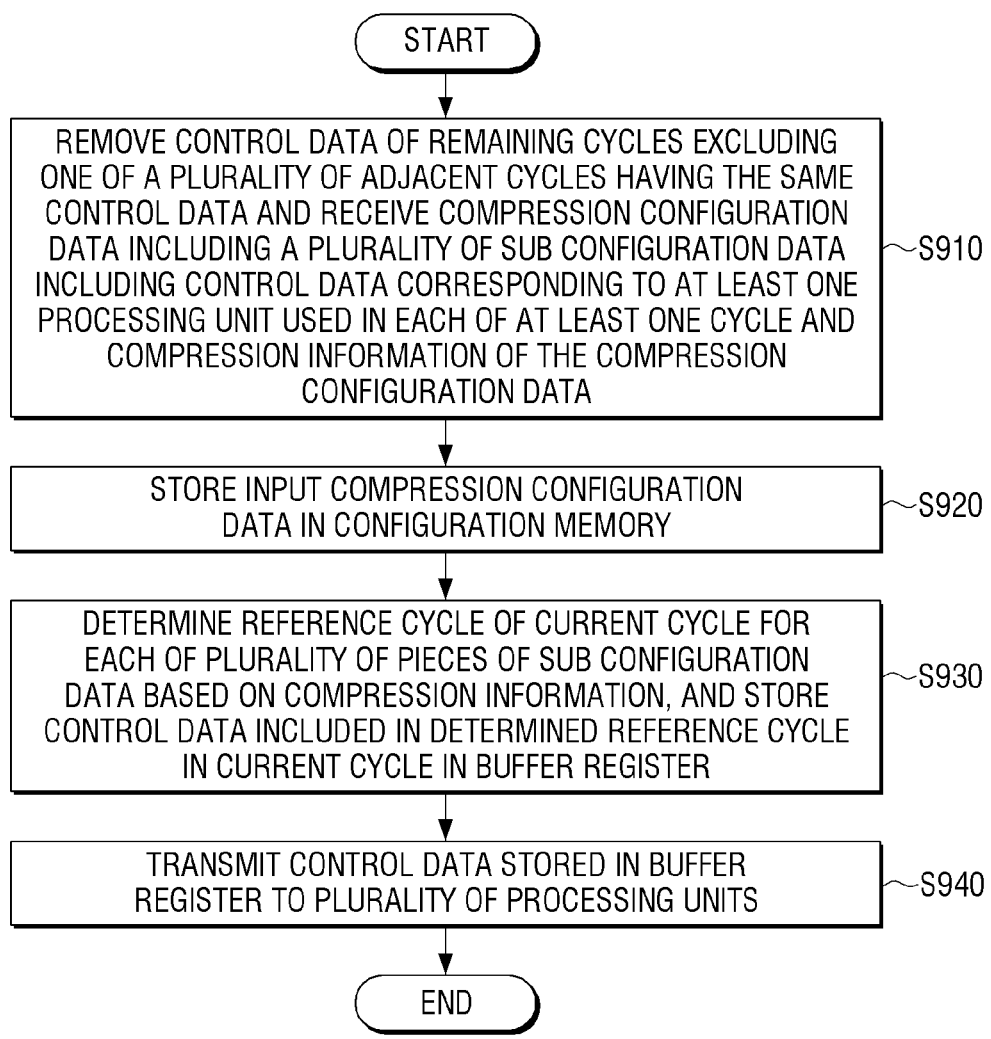
FIG. 9 is a flowchart illustrating a method of controlling a reconfigurable processor, according to an embodiment of the present disclosure.

FIG. 9 is a flowchart illustrating a method of controlling a reconfigurable processor, according to an embodiment of the present disclosure.

First, control data of the remaining cycles, excluding one of a plurality of adjacent cycles having the same control data, is removed, and compression configuration data including a plurality of sub configuration data including control data corresponding to at least one processing unit used in each of at least one cycle and compression information of the compression configuration data is received, at operation S910. The input compression configuration data is stored in the configuration memory, at operation S920. A reference cycle of a current cycle for each of the plurality of pieces of sub configuration data is determined based on the compression information, and control data included in the determined reference cycle in the current cycle is stored in the buffer register, at operation S930. The control data stored in the buffer register is transmitted to the plurality of processing units, at operation S940.

The method of FIG. 9 may further include storing information regarding a memory address in which control data corresponding to the current cycle is read from each of the plurality of pieces of sub configuration data in a plurality of memories The storing in the buffer register of operation S930 may include updating information stored in each of the plurality of memories based on the compression information, and reading control data corresponding to the current cycle from the configuration memory based on information stored in memory corresponding to each of the plurality of pieces of sub configuration data and storing the read control data in the buffer register. The compression information may include information regarding whether control data is deleted. The control data is included in each cycle for each of the plurality of sub configuration data.

The information regarding a memory address in which control data corresponding to the current cycle is read is a flag indicating information regarding the memory address, and the updating maintains a current flag value if the current cycle is removed, and changes current flag value if the current cycle is not removed.

The method of FIG. 9 may further include receiving valid information regarding a processing unit valid in at least one cycle, which is included in the compression configuration data. The storing in the buffer register of operation S930 may include determining a processing unit valid in the current cycle based on the received valid information, and storing control data corresponding to the valid processing unit among control data included in the determined reference cycle in the buffer register in a current cycle.

The plurality of processing units include at least one of at least one function unit, at least one constant unit, at least one multiplexer, and at least one register file.

According to embodiments of the present disclosure, as the electronic device compresses configuration data, size and power consumption of the reconfigurable processor, which restores and processes the configuration data, may be reduced.

As described above, the electronic device, which partitions configuration data into a plurality of pieces of sub configuration data, and the reconfigurable processor, which includes a plurality of configuration memories corresponding to the electronic device in hardware, have been described. For example, if the electronic device partitions the configuration data into 4 pieces of sub configuration data, the reconfigurable processor to restore the 4 pieces of sub configuration data may include 4 configuration memories. The width of each configuration memory may be the same as the length of corresponding sub configuration data.

Accordingly, if the partitioning method of the electronic device is changed, the design of the reconfigurable processor is required to be changed. For example, if the electronic device partitions the configuration data into 3 pieces of sub configuration data, a reconfigurable processor which includes 4 configuration memories cannot process the 3 pieces of sub configuration data.

However, the partitioning method of the electronic device having to correspond to a hardware configuration of the reconfigurable processor is merely an embodiment of the present disclosure, and the reconfigurable processor may be designed widely.

For example, the reconfigurable processor may include configuration memory configured to a plurality of memories, and restore and process compression configuration data by including a decoder among the plurality of memories and a buffer register.

Here, information regarding a partitioning method of the electronic device may be transmitted to the decoder. The decoder may restore compression configuration data based on the received information. The restoring method of the compression configuration data of the decoder may be the same as the above-described restoring method of the compression configuration data of the reconfigurable processor.

For example, if the electronic device partitions the configuration data into 3 pieces of sub configuration data, the reconfigurable processor, even including 4 configuration memories, may store 3 pieces of sub configuration data using 3 configuration memories. In addition, a decoder of the reconfigurable processor may obtain control data, which will be processed for each cycle, from the stored 3 pieces of sub configuration data, based on information regarding the partitioning method of the electronic device, and transmit the obtained control data to a buffer register.

Each of a plurality of pieces of compression configuration data for a plurality of applications may be stored in a plurality of configuration memories. A decoder may also restore and process a plurality of pieces of compression configuration data based on the partitioning method of the electronic device.

The methods, according to embodiments of the present disclosure, may be programmed and stored in various storage media. Accordingly, the methods, according to embodiments of the present disclosure, may be realized in various types of electronic devices to execute a storage medium.

Specifically, a non-transitory computer-readable medium may be provided having a program for sequentially performing the above-described controlling method.

A non-transitory computer readable medium is a medium that can be read by a computer and that is capable of storing data semi-permanently and not a medium that stores data for a short period of time such as a register, cache and memory, and the like. More specifically, the aforementioned various applications or programs may be stored in a non-transitory computer readable medium such as a compact disc (CD), digital versatile disc (DVD), hard disc, Blue-ray disc, universal serial bus (USB), memory card, read only memory (ROM), and the like, and be provided.

While the disclosure has been shown and described with reference to certain embodiments thereof, it will be understood by those skilled in the art that various changes in form and detail may be made therein without departing from the spirit and scope of the disclosure as defined by the appended claims.

What is claimed is:

1. An electronic device for compressing configuration data used in a reconfigurable processor including a plurality of processing units, the device comprising:
   a storage; and
   a processor configured to:
      control the storage to store the configuration data, which comprises control data corresponding to at least one processing unit used in each of a plurality of cycles,
      divide the plurality of processing units included in the configuration data into a plurality of groups,
      partition the configuration data into a plurality of pieces of sub-configuration data, each piece of sub-configuration data corresponding to a respective one of the plurality of groups, and
      if a plurality of adjacent cycles include identical control data, compress the configuration data by deleting control data of all but one of the plurality of adjacent cycles, for each sub-configuration data.

2. The electronic device as claimed in claim 1, wherein the processor, for each sub-configuration data, if all control data of a first cycle is identical to some of control data of a second cycle adjacent to the first cycle, is further configured to update control data of the first cycle of at least one processing unit corresponding to remaining control data of the second cycle to be identical to remaining control data of the second cycle, and compress the configuration data by deleting any one of control data of the first cycle and the second cycle.

3. The electronic device as claimed in claim 2, wherein the processor is further configured to generate valid information for a valid processing unit in each of at least one cycle included in the configuration data.

4. The electronic device as claimed in claim 1, wherein the processor is further configured to generate compression information including information regarding whether control data included in each cycle is deleted for each of the plurality of pieces of sub-configuration data.

5. The electronic device as claimed in claim 1, wherein the plurality of processing units include at least one of at least one function unit, at least one constant unit, at least one multiplexer, and at least one register file.

6. A reconfigurable processor for restoring and processing configuration data, the processor comprising:
   a plurality of processing units;
   a buffer register configured to transmit control data to the plurality of processing units;
   an inputter configured to receive compression configuration data, which comprises a plurality of pieces of sub-configuration data and compression information of the compression configuration data; and
   a configuration memory configured to store the compression configuration data,
   wherein each of the plurality of pieces of sub-configuration data includes control data corresponding to at least one processing unit used in at least one cycle, respectively, and control data of all but one of a plurality of adjacent cycles comprising identical control data is removed, and
   wherein the reconfigurable processor determines a reference cycle of a current cycle for each of the plurality of pieces of sub-configuration data based on the compression information, and stores control data included in the reference cycle in the current cycle in the buffer register.

7. The reconfigurable processor as claimed in claim 6, further comprising:
   a plurality of memories configured to store information regarding a memory address in which control data corresponding to the current cycle is read from each of the plurality of pieces of sub-configuration data,
   wherein the compression information comprises information regarding whether control data is deleted, and the control data that is included in each cycle, for each of the plurality of sub-configuration data, and
   wherein the reconfigurable processor updates information stored in each of the plurality of memories based on the compression information, reads control data corresponding to the current cycle from the configuration memory based on information stored in a memory corresponding to each of the plurality of pieces of sub-configuration data, and stores the control data in the buffer register.

8. The reconfigurable processor as claimed in claim 7, wherein:
   the information regarding the memory address in which control data corresponding to the current cycle is read is a flag indicating information regarding the memory address, and
   wherein the reconfigurable processor maintains a current flag value if the current cycle is removed, and changes the current flag value if the current cycle is not removed.

9. The reconfigurable processor as claimed in claim 6, wherein:
   the inputter receives valid information regarding a processing unit that is valid in at least one cycle, which is included in the compression configuration data, and
   the reconfigurable processor determines a processing unit valid in the current cycle based on the valid information, and stores control data corresponding to the processing unit that is valid in the current cycle among control data included in the determined reference cycle in the buffer register in the current cycle.

10. The reconfigurable processor as claimed in claim 6, wherein the plurality of processing units comprise at least one of at least one function unit, at least one constant unit, at least one multiplexer, and at least one register file.

11. A method of an electronic device for compressing configuration data used in a reconfigurable processor including a plurality of processing units, the method comprising:

storing the configuration data, which comprises control data corresponding to at least one processing unit used in each of a plurality of cycles;

dividing a plurality of processing units included in the configuration data into a plurality of groups;

partitioning the configuration data into a plurality of pieces of sub-configuration data, each piece of sub-configuration data corresponding to a respective one of the plurality of groups; and if a plurality of adjacent cycles include identical control data, compressing the configuration data by deleting control data of all but one of the plurality of adjacent cycles, for each sub-configuration data.

12. The method as claimed in claim 11, further comprising:

for each sub-configuration data, if all control data of a first cycle is identical to some of control data of a second cycle adjacent to the first cycle, updating control data of the first cycle of at least one processing unit corresponding to remaining control data of the second cycle to be identical to remaining control data of the second cycle;

wherein the compressing compresses the configuration data by deleting any one of control data of the first cycle and the second cycle.

13. The method as claimed in claim 12, further comprising:

generating valid information for a valid processing unit in each of at least one cycle included in the configuration data.

14. The method as claimed in claim 11, further comprising:

generating compression information including information regarding whether control data included in each cycle is deleted for each of the plurality of pieces of sub-configuration data.

15. The method as claimed in claim 11, wherein the plurality of processing units include at least one of at least one function unit, at least one constant unit, at least one multiplexer, and at least one register file.

* * * * *